United States Patent
Schoenstein et al.

(10) Patent No.: US 6,531,771 B1
(45) Date of Patent: Mar. 11, 2003

(54) DISSIPATION OF HEAT FROM A CIRCUIT BOARD HAVING BARE SILICON CHIPS MOUNTED THEREON

(75) Inventors: Paul G. Schoenstein, Redwood City, CA (US); Benjamin L. Sitler, Los Altos, CA (US); Robert H. Reamey, Palo Alto, CA (US); Christine E. Vogdes, Sunnyvale, CA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 09/890,602

(22) PCT Filed: Apr. 19, 2000

(86) PCT No.: PCT/US00/10561
§ 371 (c)(1),
(2), (4) Date: Nov. 6, 2001

(87) PCT Pub. No.: WO00/63968
PCT Pub. Date: Oct. 26, 2000

Related U.S. Application Data

(60) Continuation-in-part of application No. 09/697,371, filed on Oct. 25, 2000, now abandoned, which is a division of application No. 09/295,081, filed on Apr. 20, 1999, now Pat. No. 6,162,663.

(51) Int. Cl.[7] .................................................. H01L 23/34
(52) U.S. Cl. ........................................ 257/720; 438/122
(58) Field of Search ................................ 438/122–127; 257/706, 712–720; 427/44, 510

(56) References Cited

U.S. PATENT DOCUMENTS

| | | | |
|---|---|---|---|
| 3,020,260 A | 2/1962 | Nelson | 260/46.5 |
| 4,595,635 A | 6/1986 | Dubrow et al. | 428/447 |
| 4,600,261 A | 7/1986 | Debbaut | 339/116 C |

(List continued on next page.)

FOREIGN PATENT DOCUMENTS

EP  0 453 764 A1  10/1991

OTHER PUBLICATIONS

"Low Profile Packaging Method" Research Disclosure, GB, No. 321 Dated Jan. 1991.
Electronic Packaging and Production, pp. 12–20 (NEPCON West '99).
Chomerics (brochure), "Thermal Management Materials—a Guide to Thermal Transfer" (1997).

*Primary Examiner*—Matthew Smith
*Assistant Examiner*—Calvin Lee

(57) ABSTRACT

A method is disclosed for making a heat dissipation arrangement for a circuit board on which are mounted bare silicon chips having an exposed face. A heat spreader has a planar portion, on whose inner face (facing the circuit board) are applied one or more pads of a gel composition. The pad(s) are positioned opposite the bare silicon chips when the heat spreader is attached to the circuit board and completely cover the exposed faces of the chips. The gel composition has a cohesive strength greater than its adhesive strength, has a compression modulus of less than 1.38 MPa, and has a thermal conductivity greater than 1.0 W/m-°C., and a thickness of between about 0.08 mm and about 1.0 mm. The low compression modulus of the gel material protects the chips from the transmission of mechanical stresses thereto.

12 Claims, 4 Drawing Sheets

U.S. PATENT DOCUMENTS

| | | | |
|---|---|---|---|
| 4,634,207 A | 1/1987 | Debbaut | 339/116 C |
| 4,654,754 A | 3/1987 | Daszkowski | 361/388 |
| 4,777,063 A | 10/1988 | Dubrow et al. | 427/44 |
| 4,979,074 A | 12/1990 | Morley et al. | 361/386 |
| 5,060,114 A | 10/1991 | Feinberg et al. | 361/387 |
| 5,079,300 A | 1/1992 | Dubrow et al. | 525/106 |
| 5,104,930 A | 4/1992 | Rinde et al. | 524/871 |
| 5,227,663 A | 7/1993 | Patil et al. | 257/718 |
| 5,268,815 A | 12/1993 | Cipolla et al. | 631/704 |
| 5,311,060 A | 5/1994 | Rostoker et al. | 257/796 |
| 5,315,480 A | 5/1994 | Samarov | 361/705 |
| 5,357,057 A | 10/1994 | Debbaut | 174/84 R |
| 5,440,172 A | 8/1995 | Sutrina | 257/712 |
| 5,552,635 A | 9/1996 | Kim et al. | 257/706 |
| 5,604,978 A | 2/1997 | Sherif et al. | 29/840 |
| 5,646,828 A | 7/1997 | Degani et al. | 361/715 |
| 5,661,902 A | 9/1997 | Katchmar | 29/840 |
| 5,672,548 A | 9/1997 | Culnane et al. | 437/209 |
| 5,741,579 A * | 4/1998 | Nishizawa | 428/215 |
| 5,812,374 A | 9/1998 | Shuff | 361/704 |
| 5,847,929 A | 12/1998 | Bernier et al. | 361/719 |
| 5,849,824 A | 12/1998 | Mercer et al. | 524/297 |
| 5,886,111 A | 3/1999 | Chiotis et al. | 525/478 |
| 5,929,138 A | 7/1999 | Mercer et al. | 523/220 |
| 5,968,606 A * | 10/1999 | Osuna et al. | 427/510 |

* cited by examiner

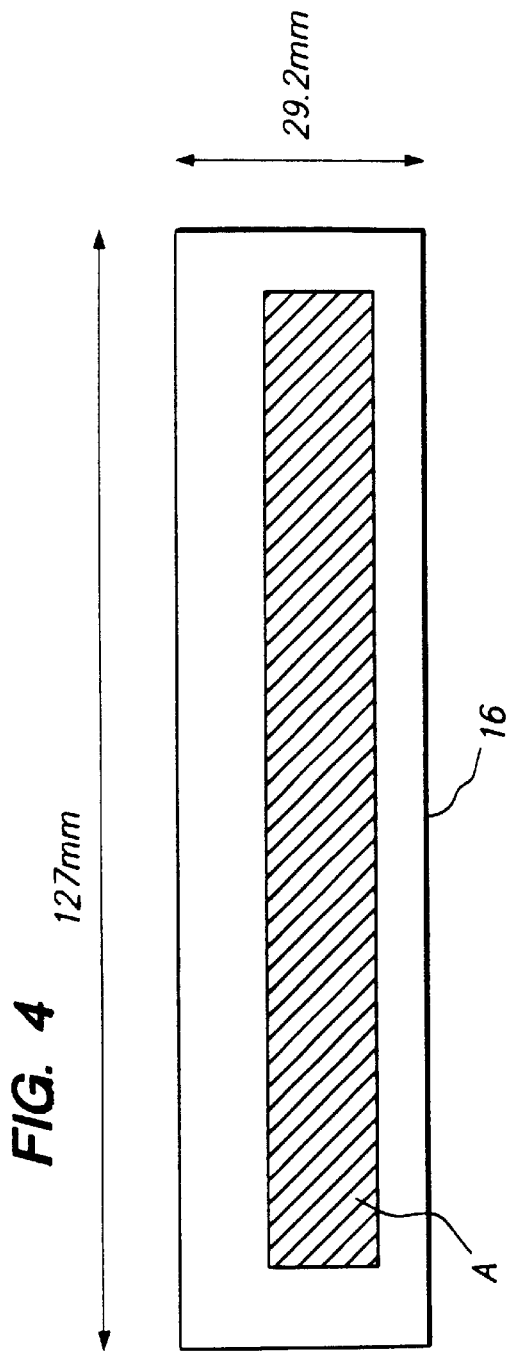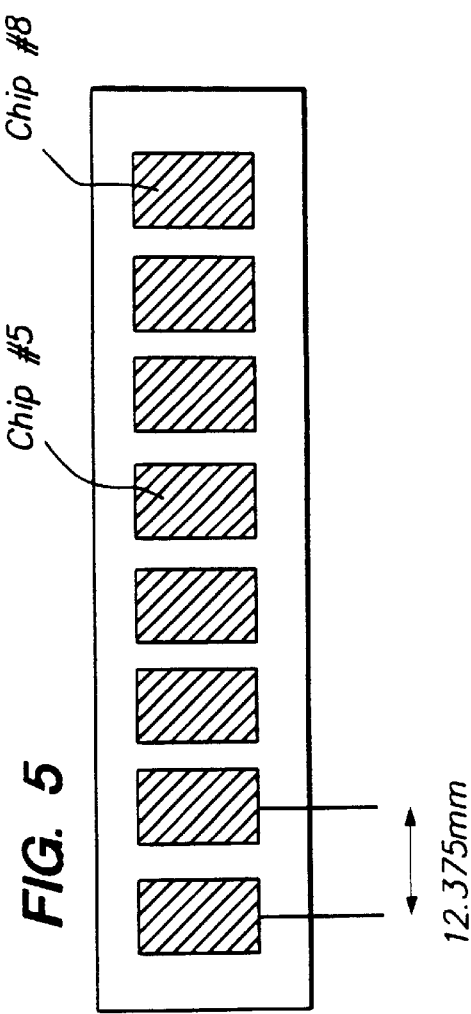

DISSIPATION OF HEAT FROM A CIRCUIT BOARD HAVING BARE SILICON CHIPS MOUNTED THEREON

This application is a continuation-in-part application of U.S. Ser. No. 09/697,371 filed on Oct. 25, 2000 now abandoned, which is a divisional of U.S. Ser. No. 09/295,081, filed Apr. 20, 1999, now U.S. Pat. No. 6,162,663.

BACKGROUND OF THE INVENTION

1. Field of the Invention

This invention relates to the dissipation of heat from a circuit board having bare silicon chips mounted thereon.

2. Description of Related Art

Circuit boards having mounted thereon electronic components such as integrated circuit chips are of course well known. Frequently the components generate sufficient heat so that a heat dissipation means must be provided. One means is simply a fan blowing air across the circuit board. Another means is a heat sink thermally connected to the circuit board (or the components). The heat sink may be positioned either on the front side of the circuit board (the side bearing the components) or the back side (the side opposite the one bearing the components). A thermally conductive material may be used to establish thermal contact between the heat sink and the heat-producing components and/or the circuit board. Illustrative disclosures relating to heat dissipation in circuit boards include Cipolla et al., U.S. Pat. No. 5,268,815 (1993); Kim et al., U.S. Pat. No. 5,552,635 (1996); and Shuff, U.S. Pat. No. 5,812,374 (1998).

There have been recent developments involving circuit boards in which the components are bare silicon chips. Bare silicon chips are chips in which the exposed surface is silicon unprotected by molded plastic packaging (although the chip may have a thin passivating or protective layer). Bare silicon chip technology is also known as Direct Chip Attach or DCA technology and is further described in publications such as Electronic Packaging & Production, pp. 12–20 (NEPCON West '99). An example is DRAM chip sets developed by Rambus Inc., of Mountain View, Calif. Because these chips consume more power than a typical memory chip, a more aggressive heat dissipation design is required. For example, if a fan alone is used for heat dissipation, a ducted fan with extremely high flow rate is required, at a cost of increased power consumption and noisiness. In other designs, two fans are used, one for cooling the microprocessor chip and a separate, dedicated one for the DRAM chips. At the same time, unpackaged nature of bare silicon chips makes them more vulnerable to damage if proper care is not taken.

Raychem Corporation, of Menlo Park, Calif., has sold internally supported thermally conductive gel materials as interface materials for heat dissipation in circuit boards. Such materials are depicted in FIGS. 1a and 1b of allowed copending, commonly assigned application of Mercer et al., Ser. No. 08/746,024, filed Nov. 5, 1996. A customer purchases the supported gel material and affixes it to his own circuit board or heat sink. The internal support, in the form of a fiberglass mat embedded within the gel composition, is necessary to provide the necessary handleability; otherwise, the gel composition is too soft, tacky, and fragile. However, the support increases the compression modulus of the gel article, so that mechanical stresses are undesirably transmitted to the underlying electronic components.

Thus, it is desirable to develop a method for dissipating heat from bare silicon chip containing circuit boards, while at the same time protecting them from mechanical stresses or avoiding the transmission of such stresses to the bare silicon chips.

BRIEF SUMMARY OF THE INVENTION

We have made an invention which effectively dissipates heat from bare silicon chip circuit boards while at the same time physically protecting the chips. Accordingly, we disclose a method of making a heat dissipation arrangement for a circuit board having plural bare silicon chips mounted thereon, comprising the steps of:

(a) providing a circuit board having a plural bare silicon chips mounted thereon, the plural bare silicon chips each having an exposed face;

(b) providing a heat spreader having a substantially planar portion having inner and outer faces and being sized and shaped for attachment to the circuit board such that the inner face of the planar portion faces the side of the circuit board bearing the bare silicon chips;

(c) applying to the inner face a precursor composition curable to a gel composition having a cohesive strength greater than its adhesive strength, a compression modulus less than 1.38 MPa, and a thermal conductivity greater than 1.0 W/m-°C.;

(d) curing the precursor composition to convert the precursor composition to the gel composition such that the gel composition forms at least one pad having a thickness between about 0.08 mm and about 1.0 mm; the at least one pad being positioned to contact and completely cover the exposed faces of the plural bare silicon chips when the heat spreader is attached to the circuit board; and (e) attaching the heat spreader to the circuit board so that the at least one pad of gel composition contacts and completely covers the exposed faces of the plural bare silicon chips.

In another embodiment of the invention, there is provided a combination assemblable into a circuit board arrangement having provision for heat dissipation, comprising:

a circuit board having a plural bare silicon chips mounted thereon, the plural bare silicon chips each having an exposed face;

a heat spreader spaced apart from the circuit board and having a substantially planar portion having inner and outer faces and being sized and shaped for attachment to the circuit board such that the inner face of the planar portion faces the side of the circuit board bearing the bare silicon chips;

a gel composition on the inner face of the heat spreader, the gel composition having a cohesive strength greater than its adhesive strength, a compression modulus less than 1.38 MPa, and a thermal conductivity greater than 1.0 W/m-°C.; the gel composition forming at least one pad having a thickness between about 0.08 mm and about 1.0 mm; the at least one pad being positioned to contact and completely cover the exposed faces of the plural bare silicon chips when the heat spreader is attached to the circuit board.

BRIEF DESCRIPTION OF THE DRAWING(S)

FIG. 4 shows a heat spreader used for thermal characterization measurements in one of the examples.

FIG. 5 shows a chipset used for thermal characterization measurements in one of the examples.

Herein, numerals repeated from one figure to the other depict the same or equivalent the same elements.

DETAILED DESCRIPTION OF THE INVENTION

Figure 1A:
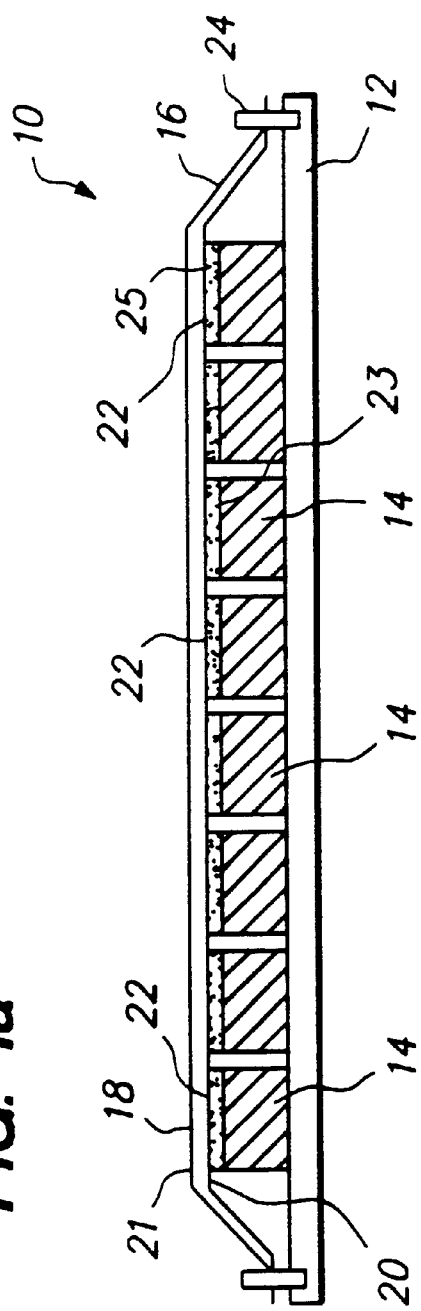
FIGS. 1a and 1b shows heat dissipation arrangements according to this invention.

FIG. 1a shows a heat dissipation arrangement 10 made according to this invention. Arrangement 10 comprises a circuit board 12 having plural bare silicon chips 14 mounted on one side thereof. (Other electronic components may also be mounted on circuit board 12.) To dissipate heat generated by chips 14 (or other electronic components, if present), a heat spreader 16 is attached to the side of circuit board 12 on which chips 14 are mounted. Heat spreader 16 has a planar portion 18 having inner and outer faces 20 and 21, respectively. Chips 14 have faces 25 which are exposed, prior to the attachment of heat spreader 16. When heat spreader 16 is attached to circuit board 12, inner face 20 faces chips 14 and their faces 25 are completely covered by plural discrete pads 22 of thermally conductive gel composition 23, one chip per pad. Thermal contact between chips 14 and heat spreader 16 is established via pads 22, with gel composition 23 acting as a thermal interface material. Each pad 22 has a contour substantially corresponding to that of a respective chip 14 in respect of which it is oppositely situated. Pads 22 conduct heat generated by chips 14 to heat spreader 16, which dissipates the heat. The heat may be dissipated by simple thermal conduction down the long axis of heat spreader 16, as generally only one chip at a time is hot. Natural convection currents set up by thermal gradients or by air currents due to a cooling fan for an associated CPU may also contribute to heat removal. (An advantage of the present invention is that it dispenses with the need for a fan dedicated to cooling of bare silicon chips 14, compared to some conventional designs). The front side attachment of heat spreader 16 offers the additional benefit of physically protecting the bare silicon chips 14.

An attachment means 24 attaches circuit board 12 and heat spreader 16 to each other. It can be a post in circuit board 12 passing through a hole in heat spreader 16 (or vice versa), or other attachment means such as a clip (either integrally formed as part of heat spreader 16 or a separately provided component), a rivet, a screw, a spring pin, etc.

Figure 1B:
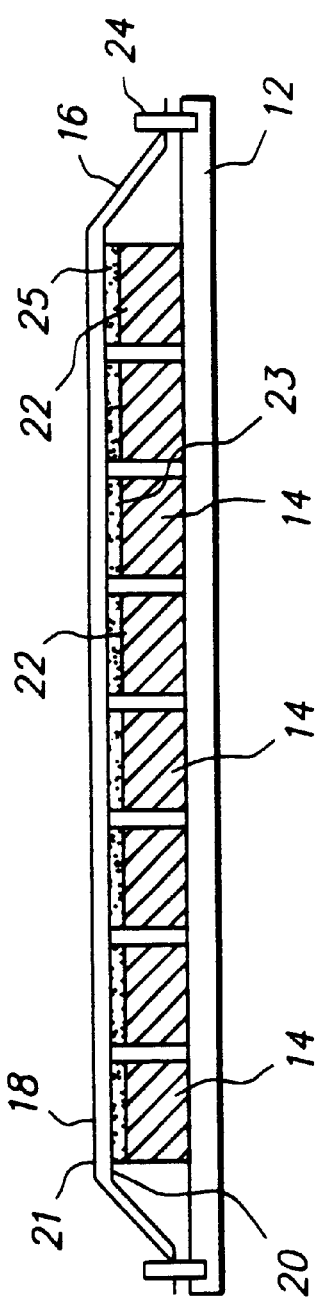

FIG. 1b shows an alternative heat dissipation arrangement made according to the invention, differing in that there is a single continuous pad of gel composition, instead of plural pads. Other alternative heat dissipation arrangements are within the scope of the present invention, such as any configuration which substantially covers the surface of the chips. By "substantially" is meant more than 50%, preferably more than 75%, more preferably more than 80%. Desired configurations may be a plurality of continuous or discontinuous discrete spaced apart stripes, beads, dots or rectangles.

The fragility of chips 14 and their heat output makes it important to achieve good thermal contact with as little mechanical stress as possible. Towards this end, gel composition 23 should be very soft, i.e., have a low compression modulus, of less than 1.38 MPa (200 psi), preferably less than 0.69 MPa (100 psi). Compression modulus is the modulus at 10% compression as measured per ASTM D 575 (1991), using a 25.4 mm (1 in.) disk, 3 mm thick, at 0.1 mm/min compression rate. Pads 22 should be very thin, having a thickness of between about 0.08 mm and about 1.0 mm, based on the cured gel composition.

Heat spreader 16 preferably is thin at planar portion 18, meaning a thickness of less than 5 mm. A thick, heavy heat spreader 16, while possibly preferable from a heat dissipation point of view, is disadvantageous due to cost, weight, and space limitations. Heat spreader 16 (or at least the planar portion thereof) preferably is made of a material having high thermal conductivity, preferably a metal and more preferably a highly thermally conductive metal such as aluminum or copper. Although not required for this invention, heat spreader 16 may have fins for radiating heat or thicker portions distal from planar portion for acting as heat sinks, or heat spreader 16 may be thermally connected to another heat sink element.

Figure 2:
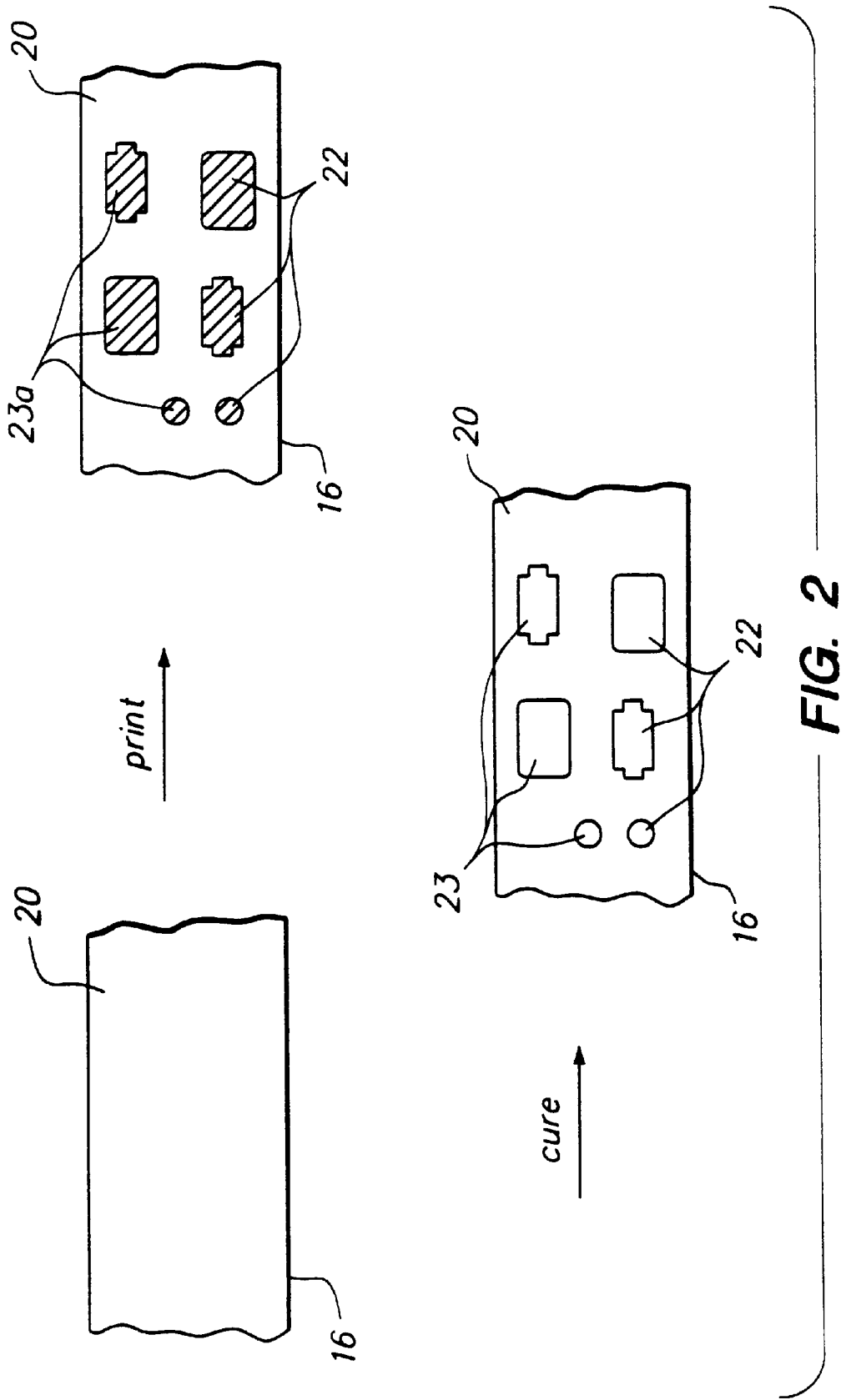
FIG. 2 shows schematically a method of this invention.

The method of this invention is illustrated in FIG. 2. Pads 22 of a gel precursor composition 23a are applied to inner face 20 of heat spreader 16 (shown in partial view with inner face 20 up). A pad 22 may be applied by conventional printing processes such as gravure or flexographic printing or, alternatively, by methods which allow a thicker layer to be applied, such as screen printing or stencil printing, for example greater than 0.25 mm in thickness. A thicker layer may also be achieved by dispensing disconnected beads, lenses, ribbons, or dots of precursor composition 23a which knit together during cure to form a continuous body of gel composition 23. A combination of dispensing and stencil printing may be employed to control final material size (area) and thickness.

Each pad has a contour corresponding to that of a chip 14 with which it will eventually be opposed. In this depiction, pads 22 having varied contours and irregular positioning are shown. It is understood that pads 22 could just as well have all the same contour and a regular positioning, for example arranged in an array, depending on the contours and positioning of chips 14 and other electronic components, or some other combination of size, shape and positioning. Gel precursor composition 23a is cured to convert it to gel composition 23. Thus, each pad comprises a single (i.e., continuous or integral) body of gel composition 23. Conveniently, precursor composition 23a is applied also as a continuous body of substantially the same size, shape, and thickness as that desired for gel composition 23 and then cured, there being little change in these parameters upon curing. The curing method depends on the selected cure chemistry. It may be heating (for heat curable compositions, for example 10 min at 60° C.), UV light (for photocurable compositions), or simply the passage of time (for room-temperature curing compositions, for example about 2 hr at room temperature). After curing, heat spreader 16 and circuit board 12 are attached to each other to produce arrangement 10. This method is particularly desirable for the manufacture of electronic modules because the heat spreader plus interface material (gel) can be manufactured, shipped, and stored, to be used when and as needed in the manufacture of the final circuit board assembly. (During storage, the gel may be protected by a release sheet.)

Figure 3:
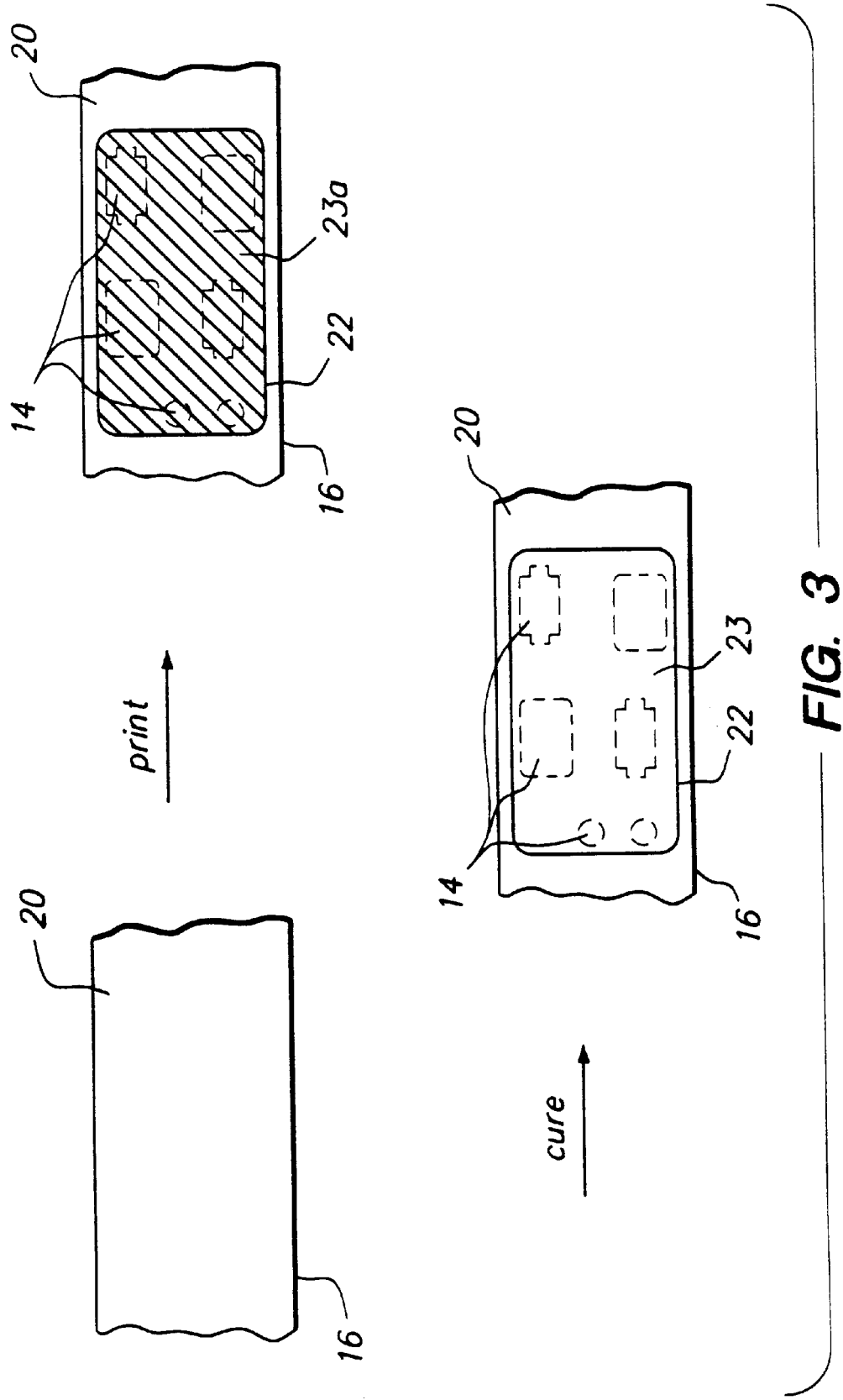
FIG. 3 shows schematically an alternative method of this invention.

FIG. 3 shows an alternative embodiment of the invention, differing in that a single gel pad 22 is formed, sufficient in size to substantially completely cover the exposed surfaces of chips 14 (contours shown in outline with dotted lines). Not shown are alternative embodiments of the invention in which exposed surfaces of the chips are substantially, although not completely covered. By "substantially" is meant more than 50%, preferably more than 75% and more preferably more than 80%. Other patterns may be employed, for example, continuous or discontinuous discrete stripes oriented such that their longitudinal axes are parallel, but spaced slightly apart from each other. Other patterns may include beads, dots or rectangles.

The highly conformable gel used herein minimizes mechanical stress on both the circuit board and the bare silicon chips and other electronic components thereon. The gel composition also accommodates variations in the heights of the components, either due to design specifications or to manufacturing variations. At the same time, heat transfer away from the chips is maximized, enabling the use of a conventional fan system, or even no fan at all, in conjunction therewith. The adhesive, highly elastic, and highly thermally conductive nature of the gel composition serves to maintain thermal contact despite minor movements (either temporary or permanent) of the bare silicon chips and heat spreader relative to each other, such as might occur due to vibration or minor dislocations during transit or service.

The conformable nature of the gel is also important in minimizing the stress on the circuit board and bare silicon chips experienced during temperature cycling in the course of normal use. During temperature cycling, harder interfacial materials such as those based on silicone elastomers or epoxy adhesives can create enough stress to break the connection between the chips and the circuit board.

This invention offers an advantage over the prior art, which employs a supported gel composition, the support being necessary for the handling of the very soft and tacky gel composition. However, the support material (typically a mesh of fiberglass or polymer) increases the compression modulus of the supported gel composition, making it undesirably hard. By forming pads of gel of prescribed contours on the heat spreader cured directly onto the heat spreader, the need for a support mesh to provide handleability is eliminated, with the result that the gel has an overall lower compression modulus.

Suitable gel compositions include systems based on polyurethanes, polyureas, silicones (also known as polysiloxanes or organopolysiloxanes), anhydride containing polymers, and the like. Exemplary disclosures include Dubrow et al., U.S. Pat. No. 4,595,635 (1986); Debbaut, U.S. Pat. No. 4,600,261 (1986); Dubrow et al., U.S. Pat. No. 4,777,063 (1988); Dubrow et al., U.S. Pat. No. 5,079,300 (1992); Rinde et al., U.S. Pat. No. 5,104,930 (1992); Mercer et al., U.S. Pat. No. 5,849,824 (1998); and Chiotis et al., U.S. Pat. No. 5,886,111 (1999); the disclosures of which are incorporated herein by reference.

Preferably, the gel is a crosslinked silicone gel based on polydimethylsiloxane (PDMS) and prepared by the platinum-catalyzed reaction between a vinyl-functionalized PDMS and a hydride-functionalized PDMS. Such gels can be formed in a number of ways. One method synthesizes the crosslinked polymer in the presence of a non-reactive extender fluid, e.g. trimethylsiloxy-terminated PDMS. An alternative method fabricates the silicone gel by reacting a stoichiometric excess of a multifunctional vinyl-substituted silicone with a multifunctional hydride-substituted silicone in such a fashion that a soft, fluid-extended system is obtained. In the latter approach, a vinyl-rich sol fraction is obtained. Of course, combination systems are possible. Suitable examples of either of these gel systems are taught in, inter alia, Debbaut, U.S. Pat. No. 4,600,261 (1986); Debbaut, U.S. Pat. No. 4,634,207 (1987); Debbaut, U.S. Pat. No. 5,357,057 (1994); Dubrow et al., U.S. Pat. No. 5,079,300 (1992); Dubrow et al., U.S. Pat. No. 4,777,063 (1988); and Nelson, U.S. Pat. No. 3,020,260 (1962); the disclosures of which are incorporated herein by reference. Silicone gel systems based on alternative cure techniques such as peroxide, UV light, and high energy radiation may also be used.

In a preferred embodiment, the precursor composition comprises:
(A) a silicone composition having a viscosity of less than 50,000 cP at 25° C., comprising
  (i) an alkenyl-functionalized diorganopolysiloxane having a viscosity of between 50 and 100,000 cP at 25° C. and having at least two silicon-bonded alkenyl groups in each molecule; and
  (ii) a hydrogen-functionalized organopolysiloxane having a viscosity between 1 and 1,000,000 cP at 25° C. and containing an average of at least 2 silicon-bonded hydrogen atoms per molecule, in a quantity that provides between 0.2 and 5.0 moles of silicon-bonded hydrogen per mole of silicon-bonded alkenyl in the alkenyl-functionalized diorganopolysiloxane (i);
(B) a hydrosilation catalyst in an amount sufficient to effect the cure of the silicone composition (A); and
(C) at least 35 volume % of a particulate material having a bulk thermal conductivity of greater than 20 W/m-°C.

The silicone composition (A) may further include, in an amount of up to 80 weight %, an organosiloxane resin of the average formula $$R_a SiO_b$$

where R is a monovalent hydrocarbon group other than alkenyl and a is a numeral between 2.0 and 2.2 and b is a numeral between 0.9 and 1.0. The weight % is based on the amount of the organosiloxane resin plus alkenyl-functionalized diorganopolysiloxane (i) and hydrogen-functionalized organopolysiloxane (ii).

Thermal conductivity may be imparted by filling the gel with a particulate material having a bulk thermal conductivity greater than 20 W/m-°C. Exemplary suitable particulate materials may be selected from the group consisting of alumina, silicon carbide, zinc oxide, aluminum nitride, titanium diboride, aluminum, copper, silver, diamond, nickel, silicon, graphite, ferric oxide, beryllium oxide, titanium dioxide, magnesium oxide, and boron nitride. Typically, the particulate material is used in an amount of at least 35 volume %. The volume % is calculated based on the combined volumes of the particulate material and the gel composition.

A preferred thermally conductive but yet highly conformable gel composition for use in this invention is an alumina-filled gel disclosed in allowed co-pending, commonly assigned application of Mercer et al., Ser. No. 08/746,024, filed Nov. 5, 1996, the disclosure of which is incorporated herein by reference. The use of α-alumina in which at least 10 weight % of the α-alumina particles have a particle size of at least 74 μm makes possible the high filler levels needed to attain high thermal conductivity, without causing the decrease in elongation and softness normally associated with high filler levels. Further improvements are observed if the α-alumina and the gel (or precursor thereof) are mixed with a specific energy input of at least 10 Joule/g. The input of such specific energy has the effect making the resulting composition more conformable than it otherwise would be.

Another prior art method of thermal management uses a thermally conductive grease. Such a grease has the advantage of flowing to conform to surfaces without putting large mechanical stresses on the chips. A key disadvantage of a thermal grease is that, over time, it will tend to flow away from where it has been placed, compromising thermal conductivity. It is also undesirable to have a thermal grease flow onto other components which it was not intended to contact. Yet another disadvantage of a thermal grease is that it is messy to dispense and, after dispensing, is not amenable to packaging, shipping, and handling without being damaged or displaced. A thermally conductive grease has a very low cohesive strength; its cohesive strength is less than its adhesive strength, so that upon separation of components contacted by it, clean separation is not obtained.

The cured gels of this invention are not liquid greases, but solid, crosslinked materials which have a cohesive strength greater than their adhesive strength. The cured gels used with this invention will wet and adhere to most surfaces with the application of only a low mounting pressure (but yet have a cohesive strength greater than their adhesive strength, allowing for their ready clean removal from a substrate) and provide a low thermal resistance path from the chips and other components to the heat spreader. To determine whether a gel has a cohesive strength greater than its adhesive strength, a sample of cured gel is placed on (or dispensed onto and cured on) an aluminum plate. Another aluminum plate is placed on top of the cured gel sample. A pressure of 0.21 MPa (30 psi) is applied for at least 5 min at room temperature (ca. 25° C.) and the top aluminum plate is removed. After removal, substantially the entire cured gel sample should remain on either the top or bottom aluminum plate if its cohesive strength is greater than its adhesive strength. (It should be noted that if a gel is cured while in contact with a substrate, the adhesion of the gel to such substrate may be greater. In this specification, the adhesive strength of a gel does not mean this cured in situ adhesive strength, but the "post-cure" adhesive strength as determined by the foregoing technique.)

The gels of this invention can be characterized by a Voland hardness number, the measurement of which is described following. The instrument is a Voland-Stevens texture analyzer model LFRA, Texture Technologies Texture Analyzer TA-XT2, or like machine, using a five kg load cell to measure force, a 5 gram trigger, and ¼ inch (6.35 mm) stainless steel ball probe as described in Dubrow et al., U.S. Pat. No. 5,079,300 (1992), the disclosure of which is incorporated herein by reference. For example, a 20 mL glass vial containing about 12.5 g of analyte (gel or other material to be analyzed) is placed in the TA-XT2 analyzer and the probe is forced into the analyte at the speed of 0.2 mm/sec to a penetration depth of 4.0 mm. The hardness of the analyte is the force in grams required to force the probe to penetrate or deform the surface of the analyte for the specified 4.0 mm distance. Higher numbers signify harder materials. The data from the TA-XT2 Analyzer is recorded and analyzed on an IBM PC or like computer, running Microsystems Ltd, XT.RA Dimension Version 3.76 software.

Mounting pressures for conventional heat sinks are typically 0.14–0.34 MPa (20–50 psi), sometimes as high as 0.69 MPa (100 psi). Due to the flexing of the relatively thin planar portion 18 of heat spreader 16, generally only low mounting pressures, on the order of 0.1 MPa (15 psi) or less, are reached. The present invention allows for effective thermal contact despite the low mounting pressure. Low mounting pressures are particularly desirable with die attachment methods such as BGA (ball grid array) or μBGA, as these designs are susceptible to damage under stress.

Generally, the overall effectiveness of transfer of heat from a heat source (here, chips 14 or other electronic components) to a heat sink (here, heat spreader 16) via an intervening interface material (here, gel composition 23) may be measured by the thermal resistance according to Equation (1)

$$\theta_T = \theta_{I1} + \theta_M + \theta_{I2} \qquad (1)$$

where $\theta_T$ is the overall thermal resistance;

$\theta_M$ is the thermal resistance across the thickness of the interface material bridging a heat source and a heat sink;

$\theta_{I1}$ is the interfacial thermal resistance between heat sink and the interface material; and $\theta_{I2}$ is the interfacial thermal resistance between the heat source and the interface material.

In turn, $\theta_M$ is given by Equation (2):

$$\theta_M = t/kA \qquad (2)$$

where k is the thermal conductivity of the interface material;

t is the thickness of the interface material; and

A is the area of thermal contact.

The gel composition of the instant invention has a high thermal conductivity k, so that $\theta_M$ is small. Its high conformability and adhesive characteristics results in excellent thermal contact with both the heat source and the heat sink, to that $\theta_{I1}$ and $\theta_{I2}$ are also very small, to the point that they do not significantly contribute to the overall thermal resistance. Further, the gel pads can still be made quite thin, between about 5 and about 40 mils, so that t is small.

In the embodiment having individual discrete pads with a contour corresponding to that of a single opposed electronic component (i.e., a one-to-one pad-to-component ratio) from which heat is to be dissipated, the value of A is maximized and hence thermal resistance $\theta_M$ is reduced. This approach is preferable to having plural pads (e.g., small beads or droplets) of gel composition contacting a single component, as taught in Cipolla et al., U.S. Pat. No. 5,268,815 (1993). Cipolla's many-to-one pad-to-component ratio lowers the value of A and hence the efficiency of thermal transfer—there will be portions of a component's surface which do not contact interface material and do not participate efficiently in the heat transfer process.

The alternative embodiment, a one-to-many pad-to-component ratio in which a single continuous pad of gel material overlaps plural electronic components is as efficient as plural discrete pads in terms of thermal transfer efficiency. However, the gel composition will not have space to expand laterally during thermal excursions, resulting in mechanical stresses which may be transmitted to the bare silicon chips and is somewhat less desirable in this regard. The single pad embodiment does offer the advantage of easier fabrication, especially where the electronic components are close together. To alleviate mechanical stresses transmitted to the bare silicon chips, alternative configurations such as continuous or discrete stripes, beads, dots or rectangles, described above, may be employed. Upon compression, the gel composition can expand into space not previously occupied by the pads. Such configurations are efficient, while not resulting in additional mechanical stresses.

In summary, the present invention is designed to minimize overall thermal resistance $\theta_T$ by minimizing the interface thermal resistances $\theta_{I1}$ and $\theta_{I2}$ and the thermal resistance $\theta_M$ across the thickness of the interface material proper. $\theta_M$ is in turn minimized by minimizing t and maximizing k and A, while balancing other necessary material properties, such as compression modulus.

The invention may be further understood by reference to the following examples, which are provided by way of illustration, and not limitation.

EXAMPLE 1

A composition was prepared by first mixing in 72 parts by weight (39 parts by volume) of aluminum oxide (a 70:30 blend of C-75 Fine and C751 unground from Alcan Corp.) into Part A of a low viscosity (<1000 cps), low hardness (<20 g Voland Hardness) commercially available silicone gel. This Part A was prepared using a Myers high shear single shaft mixer.

A composition was then prepared by first mixing in 72 parts by weight (39 parts by volume) of aluminum oxide (as described above), into Part B of a low viscosity (<1000 cps), low hardness (<20 g Voland Hardness) commercially available silicone gel. This Part B was prepared using a Myers high shear single shaft mixer.

50 parts by weight of Part A above was then mixed with 50 parts by weight of Part B above for 3 minutes using an overhead propeller type mixer which imparts significant shear. The resultant mixture was cast into a 3.2 mm thick, 50.8 mm diameter disk mold and de-gassed for 5 minutes under a vacuum of less than 29 inches Hg. This sample was cured for two hours at 80° C. to produce a crosslinked composition.

This disk was tested for bulk thermal conductivity per ASTM E1530 (1993). The resultant value was 1.08 W/m°K. at a test temperature of 70° C. The compression modulus of this material at 10% compression (per ASTM D 575-91 as described above) was 32 psi (0.22 MPa).

This same composition of 50 parts by weight of Part A above was then mixed with 50 parts by weight of Part B in a small batch and mixed by hand for 3 minutes. This uncured composition was dispensed on to the copper heat sink of an Analysis Tech Semiconductor Thermal Analyzer, Model-10A. A pad of the uncured composition approximately 0.5 mm thick and 12×18 mm in width and length was formed on the heat sink. This was cured overnight at room temperature to produce a crosslinked composition.

A calibrated TIP 31 n-p-n transistor with base dimensions approximately 10×15 mm was used as the heat source. This device was brought into contact with the cured composition on the heat sink and pressure applied through a hydraulic cylinder. Thickness was measured during the application of pressure. The thermal resistance across the thermal interface, $R_{jx}$, was measured in °C./W, per equation (3):

$$R_{jx}=(T_j-T_r)/\text{Power} \quad (3)$$

where $T_j$ is the junction temperature of the silicon and $T_r$ is the reference temperature of the water cooled heat sink.

This value of $R_{jx}$ is the sum of $R_{jc}$ (junction to case) and $R_{cs}$ (case to sink). $R_{cs}$ is the thermal resistance across the thermal material of interest. The $R_{jc}$ was measured for the TIP 31 device and subtracted from $R_{jx}$. The remaining value is the apparent thermal resistance of the thermal interface material under a given applied pressure (Equation (4)):

$$T_r - R_{cs}=R_{jx}-R_{jc} \quad (4)$$

Using the area under the TIP as 1.52 cm² and the measured thickness at each pressure level, an apparent thermal conductivity (App. k) was calculated for the sample.

$$\text{App.}k=\text{thickness}/(T_r \times \text{Area})$$

For the composition described above the apparent conductivity is shown in Table 1 below.

EXAMPLE 2

This is a comparative example illustrating the importance of a low compression modulus and how a high compression modulus interface material is undesirable.

A composition was prepared by mixing in 72 parts by weight (39 parts by volume) of aluminum oxide as described in Example 1 into a medium viscosity (<5000 cps), medium hardness (<50 Shore A per ASTM D 2240-1997) commercially available silicone RTV from General Electric Company, Grade RTV615. This composition was mixed for 3 minutes using an overhead propeller type mixer which imparts significant shear.

The test sample was prepared in the same manner as in Example 1. The resultant bulk thermal conductivity from the 50.8 mm diameter disk was 0.78 W/m°K. The compression modulus of this material at 10% compression per ASTM D 575-91 as described above was 955 psi (6.59 MPa).

This same composition was then dispensed on to the copper heat sink and formed into a pad and tested for apparent conductivity as described in Example 1. These results are shown in Table 1 below.

The hardness of the material of Example 2 leads to poor thermal contact, and the resultant apparent conductivity at 69 kPa (10 psi) is only about 78% of the theoretical bulk conductivity. By contrast, the softer material of Example 1 has better thermal contact and the resultant apparent conductivity at 69 kPa (10 psi) is about 94% of the theoretical bulk conductivity.

EXAMPLE 3

A composition was prepared by mixing in 60.7 parts by weight (40 parts by volume) of boron nitride, Grade 350, from Advanced Ceramics Corporation into a low viscosity (<1000 cps), low hardness (<20 g Voland Hardness) commercially available silicone gel.

The test sample was mixed in a 60 cm³ bowl on a Brabender Plasticorder for 5 min at 45 RPM using high shear roller blades. The resultant mixture was cast into a 3.2 mm thick, 50.8 mm diameter disk mold and de-gassed for 5 min under a vacuum of less than 29 in Hg. This sample was cured for two hours at 80° C. to produce a crosslinked composition.

This disk was tested for bulk thermal conductivity per ASTM E 1530 (1993). The resultant bulk thermal conductivity from the 50.8 mm diameter disk was 1.71 W/m°K. The compression modulus of this material at 10% compression per ASTM D 575-91 as described above was 102 psi (0.70 MPa).

This same composition was then dispensed on to the copper heat sink, and formed into a pad and tested for apparent conductivity as described in Example 1. These results are shown in Table 1 below.

EXAMPLE 4

This is another comparative example with a high compression modulus silicone interface material.

A composition was prepared by mixing in 60.3 parts by weight (40 parts by volume) of boron nitride, Grade 350, into a medium viscosity (<5000 cps), medium hardness (<50 Shore A) Grade RTV615 silicone.

The test sample was mixed and prepared in the same manner as in Example 3. The resultant bulk thermal conductivity from the 50.8 mm diameter disk was 1.39 W/m° K. The compression modulus of this material at 10% compression per ASTM D 575-91 as described above was 764 psi (5.27 MPa).

This same composition was then dispensed on to the copper heat sink and formed into a pad and tested for apparent conductivity as described in Example 1. These results are shown in Table 1 below.

The hardness of the material of Example 4 leads to poor thermal contact, and the resultant apparent conductivity at 69 kPa (10 psi) is only 53% of the theoretical bulk conductivity. By contrast, the softer material of Example 3 leads to improved thermal contact and the resultant apparent conductivity at 69 kPa (10 psi) is 83% of the theoretical bulk conductivity. An apparent conductivity of 99% of the theoretical bulk conductivity can be achieved at the higher pressure level of 210 kPa (30 psi) for the material of Example 3.

TABLE 1

Apparent Thermal Conductivity (W/m-° K.)

| | 3 psi (21 kPa) | 5 psi (34 kPa) | 10 psi (69 kPa) | 20 psi (140 kPa) | 30 psi (210 kPa) |
|---|---|---|---|---|---|
| Example 1 (72% alumina in silicone gel) | 1.00 | 1.00 | 1.02 | 1.05 | 1.02 |
| Example 2 (72% alumina in silicone RTV) | 0.59 | 0.60 | 0.61 | 0.63 | 0.66 |
| Example 3 (60.7% boron nitride in silicone gel) | 1.21 | 1.33 | 1.42 | 1.48 | 1.70 |
| Example 4 (60.3% boron nitride in silicone RTV) | 0.60 | 0.66 | 0.74 | 0.91 | 1.05 |

EXAMPLE 5

A composition was prepared by first mixing in 72 parts by weight (39 parts by volume) of aluminum oxide (as described in Example 1), and 2.0 parts by weight of a thixotropic agent Aerosil R972 from Degussa Corporation, and 5.0 parts by weight of silanol terminated polydimethylsiloxane into Part A of a low viscosity (<1000 cps), low hardness (<20 g Voland Hardness) commercially available silicone gel. This Part A was prepared using a double planetary low shear mixer.

A composition was then prepared by first mixing in 72 parts by weight (39 parts by volume) of aluminum oxide (as in Example 1), and 2.0 parts by weight of a thixotropic agent (Aerosil R972) and 5.0 parts by weight of silanol terminated polydimethylsiloxane, into Part B of a low viscosity (<1000 cps), low hardness (<20 g Voland Hardness) commercially available silicone gel. This Part B is prepared using a double planetary low shear mixer.

These materials were placed into a conventional static mixing cartridge which provides a 1:1 by volume blend of Part A and Part B using a 20 element mixing section.

This composition was dispensed manually on to a sheet of release paper (Teflon coated glass cloth) and formed into a sheet of 0.5 mm thickness. This was cured overnight a room temperature to produce a crosslinked composition.

A pad approximately 95×12 mm was cut from this cured sheet and placed on the raised portion of the aluminum heat spreader shown in FIG. 4. This heat spreader had a base metal thickness of 0.96 mm and length and width as indicated in FIG. 4. Shaded area A is a raised pedestal for contacting with a thermal interface to chips and has dimensions of 97×12 mm. The nominal gap between the pedestal and chips was 0.36 mm.

This heat spreader with gel pad was brought into contact with an array of 8 bare silicon resistance heating chips (Intel Corp. test chip T13825) as shown in FIG. 5. The array of chips had evenly spaced centers 12.375 mm apart. Each chip had dimensions of 8.9×14.1×0.8 mm (width×length×height). The applied pressure was less than 10 psi (69 kPa). Chip number 8 was raised to a power level of about 1.88 W using an Hewlett-Packard 4142 Parametric Analyzer as a power supply and the chip resistance and temperature recorded. The external temperature was also recorded. The thermal resistance at equilibrium in still air was calculated as [Chip temperature—Ambient temperature)/Input power], and reported in °C./W. The procedure was repeated by raising chip number 5 to a power level of about 1.88 W and recording the thermal resistance. Results are shown in Table 2 below.

EXAMPLE 6

A composition was prepared as described in Example 5. This composition was dispensed directly on to the inner face portion of the aluminum heat spreader shown in FIG. 1. A single pad of the uncured composition was formed with dimensions approximately 95×12×0.5 mm thick. This was cured overnight at room temperature to produce a crosslinked composition.

This dispensed, cured composition was then tested as described in Example 5. Thermal resistance results are shown in Table 2 below.

EXAMPLE 7

A composition was prepared as described in Example 5 and dispensed on to the aluminum heat spreader and formed into eight discrete pads of approximately 12×11 mm. The placement of these pads was sufficient to completely cover each of the eight test chips after the heat spreader with pads of this cured composition was brought in contact with the board containing the test chips.

This dispensed, cured composition was then tested as described in Example 5. Thermal resistance results are shown in Table 2 below.

The results of Examples 5–7 show the benefits of applying a gel onto a heat spreader in accordance with this invention. The standard deviation of the measurements of thermal resistance is about 0.1° C./W. Thus, the lowering of thermal resistance by 2.1 to 2.5° C./W shown in Table 2 is statistically significant. At a power of 1.88 W used in this test, this represents a 4° C. reduction in chip temperature. In the case where more power is to be dissipated, such as 10 W, this difference would be greater than 20° C. and could lead to a significant improvement in device performance and reliability.

TABLE 2

Thermal Resistance

| Material | Thermal Resistance (° C./W) Chip #8 | Thermal Resistance (° C./W) Chip #5 |
|---|---|---|
| Example 5 Single Pad Gel slab | 31.8 | 30.2 |
| Example 6 Single Pad-Dispensed Gel | 31.1 | 29.7 |
| Example 7 Multiple Pads-Dispensed Gel | 29.7 | 27.7 |

The foregoing detailed description of the invention includes passages that are chiefly or exclusively concerned with particular parts or aspects of the invention. It is to be understood that this is for clarity and convenience, that a particular feature may be relevant in more than just the passage in which it is disclosed, and that the disclosure herein includes all the appropriate combinations of information found in the different passages. Similarly, although the various figures and descriptions herein relate to specific embodiments of the invention, it is to be understood that where a specific feature is disclosed in the context of a particular figure or embodiment, such feature can also be used, to the extent appropriate, in the context of another figure or embodiment, in combination with another feature, or in the invention in general.

Further, while the present invention has been particularly described in terms of certain preferred embodiments, the invention is not limited to such preferred embodiments. Rather, the scope of the invention is defined by the appended claims.

What is claimed is:

1. A combination assemblable into a circuit board arrangement having provision for heat dissipation, comprising
    a circuit board having a plural bare silicon chips mounted thereon, the plural bare silicon chips each having an exposed face;
    a heat spreader spaced apart from the circuit board and having a substantially planar portion having inner and outer faces and being sized and shaped for attachment to the circuit board such that the inner face of the planar portion faces the side of the circuit board bearing the bare silicon chips;
    a gel composition on the inner face of the heat spreader, the gel composition having a cohesive strength greater than its adhesive strength, a compression modulus less than 1.38 MPa, and a thermal conductivity greater than 1.0 W/m-°C.; the gel composition forming at least one pad having a thickness between about 0.08 mm and about 1.0 mm; the at least one pad being positioned to contact and completely cover the exposed faces of the plural bare silicon chips when the heat spreader is attached to the circuit board.

2. A combination according to claim 1, wherein the at least one pad of gel composition is one single continuous pad of gel composition.

3. A combination according to claim 1, wherein the at least one pad of gel composition comprises plural pads of gel composition; each pad being positioned to contact only one respective opposed bare silicon chip when the heat spreader is attached to the circuit board and having a contour substantially corresponding to that of the respective opposed bare silicon chip.

4. A combination according to claim 1, wherein the planar portion of the heat spreader has a thickness of less than 5 mm.

5. A combination according to claim 1, wherein the gel composition comprises a crosslinked silicone gel filled with a particulate material having a bulk thermal conductivity greater than 20 W/m-°C.

6. A combination according to claim 5, wherein the gel composition is made by the curing of a precursor composition comprising:
    (A) a silicone composition having a viscosity of less than 50,000 cP at 25° C., comprising
        (i) an alkenyl-functionalized diorganopolysiloxane having a viscosity of between 50 and 100,000 cP at 25° C. and having at least two silicon-bonded alkenyl groups in each molecule; and
        (ii) a hydrogen-functionalized organopolysiloxane having a viscosity between 1 and 1,000,000 cP at 25° C. and containing an average of at least 2 silicon-bonded hydrogen atoms per molecule, in a quantity that provides between 0.2 and 5.0 moles of silicon-bonded hydrogen per mole of silicon-bonded alkenyl in the alkenyl-functionalized diorganopolysiloxane (i);
    (B) a hydrosilation catalyst in an amount sufficient to effect the cure of the silicone composition (A); and
    (C) at least 35 volume % of a particulate material having a bulk thermal conductivity of greater than 20 W/m-°C.

7. A combination according to claim 6, wherein the silicone composition (A) further comprises, in an amount of up to 80 parts by weight per 100 parts by weight of alkenyl-functionalized diorganopolysiloxane (i) and hydrogen-functionalized organopolysiloxane (ii), an organosiloxane resin of the average formula $$R_a SiO_b$$

where R is a monovalent hydrocarbon group other than alkenyl and a is a numeral between 2.0 and 2.2 and b is a numeral between 0.9 and 1.0.

8. A combination according to claim 5, wherein the particulate material is selected from the group consisting of alumina, silicon carbide, zinc oxide, aluminum nitride, titanium diboride, aluminum, copper, silver, diamond, nickel, silicon, graphite, ferric oxide, beryllium oxide, titanium dioxide, magnesium oxide, and boron nitride.

9. A combination according to claim 5, wherein the particulate material comprises α-alumina wherein at least 10% by weight of the α-alumina has a particle size of at least 74 μm.

10. A combination according to claim 1, wherein the gel composition has a compression modulus less than 0.69 MPa.

11. A combination according to claim 1, wherein the at least one pad of gel composition comprises plural pads of gel, each positioned to contact at least one bare silicon chip.

12. A combination according to claim 1, wherein the at least one pad of gel composition comprises a plurality of stripes, beads, dots or rectangles.

* * * * *